US009390049B2

(12) United States Patent
Lee et al.

(10) Patent No.: US 9,390,049 B2
(45) Date of Patent: Jul. 12, 2016

(54) LOGICAL UNIT ADDRESS ASSIGNMENT

(75) Inventors: June Lee, Sunnyvale, CA (US); Terry M. Grunzke, Boise, ID (US); Dean Nobunaga, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 13/152,543

(22) Filed: Jun. 3, 2011

(65) Prior Publication Data

US 2012/0311297 A1     Dec. 6, 2012

(51) Int. Cl.
G06F 12/00 (2006.01)
G06F 13/00 (2006.01)
G06F 13/28 (2006.01)
G06F 13/42 (2006.01)
G11C 29/00 (2006.01)

(52) U.S. Cl.
CPC .......... G06F 13/4247 (2013.01); G11C 29/883 (2013.01)

(58) Field of Classification Search
CPC .......................... G06F 13/4247; G11C 29/383
USPC ......................................................... 711/209
See application file for complete search history.

(56) References Cited

U.S. PATENT DOCUMENTS

| 4,468,729 A * | 8/1984 | Schwartz ....................... 711/172 |
| 4,573,120 A * | 2/1986 | Ichimiya ............. G06F 13/4247 710/1 |
| 4,856,091 A * | 8/1989 | Taska ............................. 398/166 |
| 5,943,242 A * | 8/1999 | Vorbach et al. ................ 716/117 |
| 5,953,743 A * | 9/1999 | Jeddeloh ........................ 711/158 |
| 6,400,602 B2 * | 6/2002 | Takata ................... G11C 29/76 365/185.09 |
| 7,051,134 B2 * | 5/2006 | Chen .................... G06F 13/4247 710/113 |
| 7,228,470 B2 * | 6/2007 | Saito ............................ 714/718 |
| 7,437,602 B2 * | 10/2008 | Asari ................. G11C 11/5635 714/6.1 |
| 7,530,311 B2 * | 5/2009 | Koekemoer ............. F42D 1/055 102/215 |
| 7,586,779 B2 * | 9/2009 | Yang .................... G11C 29/883 365/149 |
| 7,774,537 B2 * | 8/2010 | Pyeon ................. G06F 13/4243 710/52 |
| 8,120,990 B2 * | 2/2012 | Kim ........................... 365/238.5 |
| 8,312,088 B2 * | 11/2012 | Pinto .................... G06F 13/4247 709/206 |
| 8,364,861 B2 * | 1/2013 | Pyeon ................. G06F 13/4247 710/10 |
| 8,478,917 B2 * | 7/2013 | Scott .................... G06F 13/4247 710/104 |

(Continued)

FOREIGN PATENT DOCUMENTS

JP          07160435 A  *  6/1995

OTHER PUBLICATIONS

Definition of effective, Dictionary.com, retrieved from http://dictionary.reference.com/browse/effective on Feb. 7, 2014 (1 page).*

*Primary Examiner* — Mark Giardino, Jr.
*Assistant Examiner* — Daniel C Chappell
(74) *Attorney, Agent, or Firm* — Dicke, Billig & Czaja, PLLC

(57) ABSTRACT

Described embodiments include logical units within a memory device with control circuitry configured to assign a logical unit address to the logical unit. Apparatus including a plurality of the logical units arranged in a daisy chain configuration and methods of assigning logical unit addresses to the logical units are also disclosed.

39 Claims, 8 Drawing Sheets

(56) References Cited

U.S. PATENT DOCUMENTS

| | | | |
|---|---|---|---|
| 8,519,734 B2* | 8/2013 | Jeong | G11C 7/20 326/9 |
| 8,619,486 B2* | 12/2013 | Hayashi | G11C 8/12 365/222 |
| 8,700,814 B2* | 4/2014 | Zhang | G06F 13/37 710/10 |
| 8,726,064 B2* | 5/2014 | Bennett | G06F 13/1684 710/100 |
| 8,909,833 B2* | 12/2014 | Prusia | G06F 13/14 710/10 |
| 9,158,727 B2* | 10/2015 | Gorbold | G06F 12/0661 |
| 2002/0067646 A1* | 6/2002 | Fister | 365/201 |
| 2002/0075749 A1* | 6/2002 | Fister | 365/236 |
| 2003/0002358 A1* | 1/2003 | Lee et al. | 365/200 |
| 2003/0112675 A1* | 6/2003 | Mukai et al. | 365/200 |
| 2004/0131054 A1* | 7/2004 | Dittmar | 370/366 |
| 2005/0251643 A1* | 11/2005 | Dirscherl et al. | 711/206 |
| 2006/0020740 A1* | 1/2006 | Bartley et al. | 711/100 |
| 2007/0076502 A1* | 4/2007 | Pyeon et al. | 365/221 |
| 2007/0165457 A1* | 7/2007 | Kim | G06F 13/1684 365/185.11 |
| 2007/0189313 A1* | 8/2007 | Bartley et al. | 370/406 |
| 2007/0233903 A1* | 10/2007 | Pyeon | 710/1 |
| 2007/0268765 A1* | 11/2007 | Woo et al. | 365/207 |
| 2008/0028160 A1* | 1/2008 | Bartley et al. | 711/154 |
| 2008/0162858 A1* | 7/2008 | Moyer | 711/170 |
| 2008/0263248 A1* | 10/2008 | Harriman | G06F 13/4247 710/243 |
| 2009/0089536 A1* | 4/2009 | Norman et al. | 711/200 |
| 2010/0095054 A1* | 4/2010 | Terasaki | 711/103 |
| 2010/0106919 A1* | 4/2010 | Manning | 711/154 |
| 2010/0157644 A1* | 6/2010 | Norman | 365/51 |
| 2010/0191894 A1* | 7/2010 | Bartley et al. | 711/5 |
| 2011/0069545 A1* | 3/2011 | Futatsuyama et al. | 365/185.03 |
| 2012/0230110 A1* | 9/2012 | Nobunaga et al. | 365/185.18 |
| 2013/0094271 A1* | 4/2013 | Schuetz | G11C 5/06 365/63 |
| 2015/0095541 A1* | 4/2015 | Chadwick, Jr. | G06F 13/4247 710/305 |

* cited by examiner ered as two separate targets (i.e., each logical unit is referenced by a separate chip enable signal). Similarly, a quadruple die package (QDP) may include four logical units arranged as two separate targets (i.e., two logical units are referenced by a single chip enable signal) or arranged as four separate targets (i.e., each logical unit is referenced by a separate chip enable signal). Similar arrangements for packages including eight or more dice are also known in the art.

LOGICAL UNIT ADDRESS ASSIGNMENT

TECHNICAL FIELD

Described embodiments relate to memory devices, in which a memory package contains a plurality of addressable memory chips.

BACKGROUND OF THE INVENTION

In a memory system for a computer or for other electronic devices, one or more memory devices are typically coupled to a memory controller via a shared bus. Memory devices may include volatile memory devices such as random-access memory (RAM), dynamic random access memory (DRAM), and synchronous dynamic random access memory (SDRAM), and/or non-volatile memory devices such as NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM).

A memory system can include a number of discrete memory devices. Each memory device is typically provided as an integrated semiconductor circuit or "package," where each package includes one or more targets. A target is a unit of memory that is enabled by a particular chip enable signal. Each target in a package may include one or more logical units of memory. A logical unit refers to a unit of memory storage that can independently execute commands and/or report status. Each logical unit may include an array of memory formed on a single semiconductor die, for example.

A package including a single target with a single logical unit is typically referred to as a single-die package (SDP). A package including multiple logical units formed on multiple semiconductor dice is typically referred to as a multi-chip package (MCP). An MCP can include a number of memory dice (also referred to as "chips"), where each die has one or more logical units associated therewith. For example, a dual die package (DDP) may include two logical units on two dice arranged as part of a single target (i.e., both logical units are referenced by a single chip enable signal) or arranged as two separate targets (i.e., each logical unit is referenced by a separate chip enable signal). Similarly, a quadruple die package (QDP) may include four logical units arranged as two separate targets (i.e., two logical units are referenced by a single chip enable signal) or arranged as four separate targets (i.e., each logical unit is referenced by a separate chip enable signal). Similar arrangements for packages including eight or more dice are also known in the art.

FIG. 1 shows a conventional memory device 100 including four logical units 110-113 formed on four separate dice. Logical units 110-113 each include at least one array of memory cells, such as NAND memory cells, or other types of memory that are known in the art. During an initialization process of memory device 100, each of logical units 110-113 is assigned a separate logical unit address, in order to enable the writing and retrieving of information stored on each logical unit 110-113. Typically, the address of each logical unit within device 100 includes a three-bit binary address, in order to accommodate up to eight logical units to be addressed separately in each package. In memory device 100, each logical unit 110-113 is assigned an address using three separate address input contacts mds<0>, mds<1>, and mds<2>. Address input contacts mds<0>, mds<1>, mds<2> are typically bond pads that are capable of being electrically connected to a device voltage pad 105 (e.g., Vcc) to establish the three bit address.

An address input contact electrically connected to device voltage 105 indicates a first logic signal (e.g., a logic high signal), while an address input contact that is not electrically connected to device voltage 105 indicates a second logic signal (e.g., a logic low signal). Accordingly, each logical unit 110-113 receives a unique three-bit logical address which may be hardwired during packaging of memory device 100. Alternatively, one of address input contacts mds<0>, mds<1>, mds<2> may be designated for receiving a signal that indicates whether the respective logical unit 110-113 is part of a memory device 100 having a QDP arrangement, commonly referred to as a "QDP enable" signal. In such an arrangement, the QDP enable address input contact is activated in each of logical units 110-113 (i.e., mds<1>), with the other address input contacts (i.e., mds<0> and mds<2>) being used to assign a respective two bit address for each of logical units 110-113.

FIG. 2 shows a functional block diagram for control circuitry 210 that may be found in each conventional logical unit (e.g., logical units 110-113) of memory device 100 (FIG. 1). Control circuitry 210 includes an input/output control circuit 220 for controlling the transfer of data, command, and address signals to and from the logical unit and control logic 221 for controlling internal operations of the logical unit. Control circuitry 210 is operably coupled to a memory section 226 of the logical unit for storing data. The memory section 226 may include an array 228 of memory cells, which may be NAND flash or other types of memory cells. Programming and readout of memory section 226 is controlled by row decoder 231 and column decoder 227. Memory section 226 also includes a data register 229 and cache register 230, as discussed further below.

Data, command, and address signals received by control circuitry 210 are multiplexed onto a single set of pins DQ[7:0] that is received by the input/output control circuit 220. Input/output control circuit 220 also receives a data strobe signal DQS that provides a synchronous reference for data input and output operations.

Input/output control 220 is coupled to an address register 222, a status register 223, and a command register 224. Address information received by input/output control circuit 220 is latched into address register 222. The latched address information is sent by address register 222 to a row decoder 231 and/or a column decoder 227 in memory section 226. Commands received by input/output control circuit 220 are latched by command register 224, and the latched commands are transferred from command register 224 to control logic 221 for generating internal signals to control internal operations of the logical unit. Data received by input/output control circuit 220 is transferred to cache register 230 and data register 229 for storage in array 228. Status register 223 is controlled by control logic 221 to report the status of the logical unit to the input/output control circuit 220.

In addition to receiving address control signals 225 from address input contacts mds<0>, mds<1>, mds<2> (FIG. 1), control logic 221 receives several external control signals. For example, control logic 221 typically receives a chip enable signal CE# for enabling or disabling the logical unit, a command latch enable signal CLE for loading a command from input/output control 220 into command register 224, an address latch enable signal ALE for loading an address from input/output control circuit 220 into address register 222, a clock signal CLK for controlling internal operations of the logical unit, a write/read enable signal W/R# for controlling whether input/output control circuit 220 is transmitting or receiving data, and a write protect signal WP# that enables or disables programming and/or erasing of data stored in memory section 226. Control logic 221 may also include an open-drain active low output 232 that outputs a ready/busy signal R/B# indicating target array activity.

Logical units 110-113 (FIG. 1) require a separate external contact for each separate control signal that control logic 221 is configured to receive, including for each of address control signals 225 (i.e., mds<0>, mds<1>, mds<2>). Each of these external contacts increases the required surface area at a perimeter of the logical unit, preventing further reduction in the size of each logical unit 110-113 (FIG. 1), and thus of the overall package 100. In addition, the number of logical units that can be packaged within a memory device is limited by the number of unique logical unit addresses that can be assigned to the logical units, and thus by the number of address control signals that the logical unit is capable of receiving. A reduction in the number of external pins would save die space and simplify memory device package processing.

DETAILED DESCRIPTION

In the following detailed description, reference is made to various embodiments of the invention. These embodiments are described with sufficient detail to enable those skilled in the art to practice them. It is to be understood that other embodiments may be employed, and that various structural, logical and electrical changes may be made. In addition, reference is made to various processes including multiple steps. It should be understood that these steps need not be performed in the order that they are listed, unless specifically stated as such.

Described embodiments include a logical unit for an apparatus, such as, for example, a circuit, a device (e.g., a memory device), or a system (e.g., a memory system) that is configured to assign a logical unit address during initialization through a daisy-chain technique. By reducing the number of external contacts required for assigning the logical unit address, the required surface area for the logical unit can be reduced. In addition, the described configuration can be used to provide one or more redundant logical units within an apparatus, such that one or more logical units within the memory device may be designated as defective (e.g., malfunctioning or non-functioning) logical units.

Figure 3:
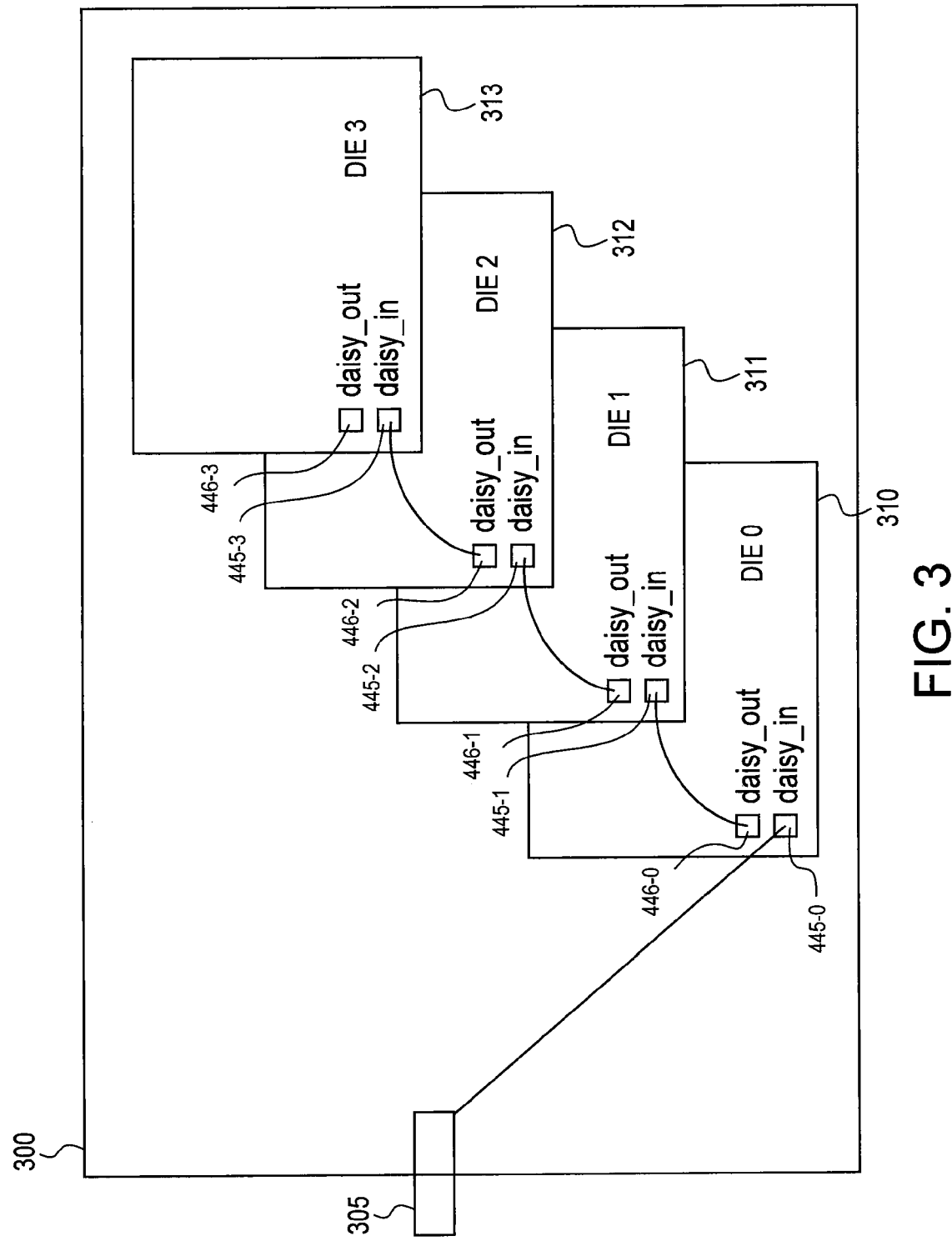
FIG. 3 is a block diagram of a memory device in accordance with embodiments described herein.

FIG. 3 is a block diagram of an embodiment of a memory device 300. Memory device 300 includes multiple logical units 310-313. Logical units 310-313 may be organized onto respective four separate dice. In another embodiment, some or all of logical units 310-313 may be formed on a single semiconductor die. Each logical unit 310-313 contains memory, as described further below, such as NAND, RAM, DRAM, SDRAM, NOR flash memory, ROM, EEPROM, EPROM, PCRAM, RRAM, MRAM, and/or STT RAM, or other types of memory that are known in the art. It should be understood that memory device 300 may also include more or less logical units and/or more or less dice containing the logical units.

Each logical unit 310-313 in memory device 300 includes an address input contact 445 for receiving an address input control signal DAISY_IN and an address output contact 446 for outputting an address output control signal DAISY_OUT. Address input contacts 445 and address output contacts 446 of each logical unit 310-313 may be, for example, bond pads that are capable of being operably coupled (e.g., electrically connected) to another bond pad on another logical unit, or to a voltage 305 or ground. Although each address input contact 445 and address output contact 446 is functionally the same, for purposes of identification of particular address input contacts 445 and address output contacts 446, number and/or letters are appended to the reference numbers 445, 446 illustrated in FIG. 3.

The address input contacts 445 and address output contacts 446 of logical units 310-313 are operably coupled (e.g., electrically connected) such that logical units 310-313 are arranged in a daisy chain configuration. For example, address output contact 446-0 of logical unit 310 can be electrically connected to address input contact 445B of logical unit 311. Logical units 312 and 313 are similarly connected in this arrangement. Address input contact 445-0 of logical unit 310 is electrically connected to a voltage 305, which may be a device voltage (i.e. Vcc), a ground voltage, or another appropriate voltage. Address output contact 446-3 of logical unit 313 is not connected to another node, or may be connected to a ground or other reference voltage.

The daisy chain configuration of logical units 310-313 in memory device 300 can be utilized to assign a logical unit address to each logical unit 310-313 during an initialization process of memory device 300. The logical unit address assigned to each logical unit 310-313 may be a unique value to the particular logical unit.

The logical unit addresses assigned to logical units 310-313 in memory device 300 are not necessarily limited to a particular range or number of bits, as described further below. For example, if memory device 300 includes four logical units that are to be assigned unique logical unit addresses (as shown in FIG. 3), each of the logical units may be assigned a respective logical unit address that is a binary two bit value ranging from binary 00 to binary 11. In another embodiment, if memory device 300 includes eight logical units that are to be assigned unique logical unit address, each of the logical units may be assigned a respective binary three bit value ranging from binary 000 to binary 111. The logical unit address can be used to uniquely identify each logical unit of a memory device when transmitting address, command, and/or data signals to and from memory device.

Figure 4:
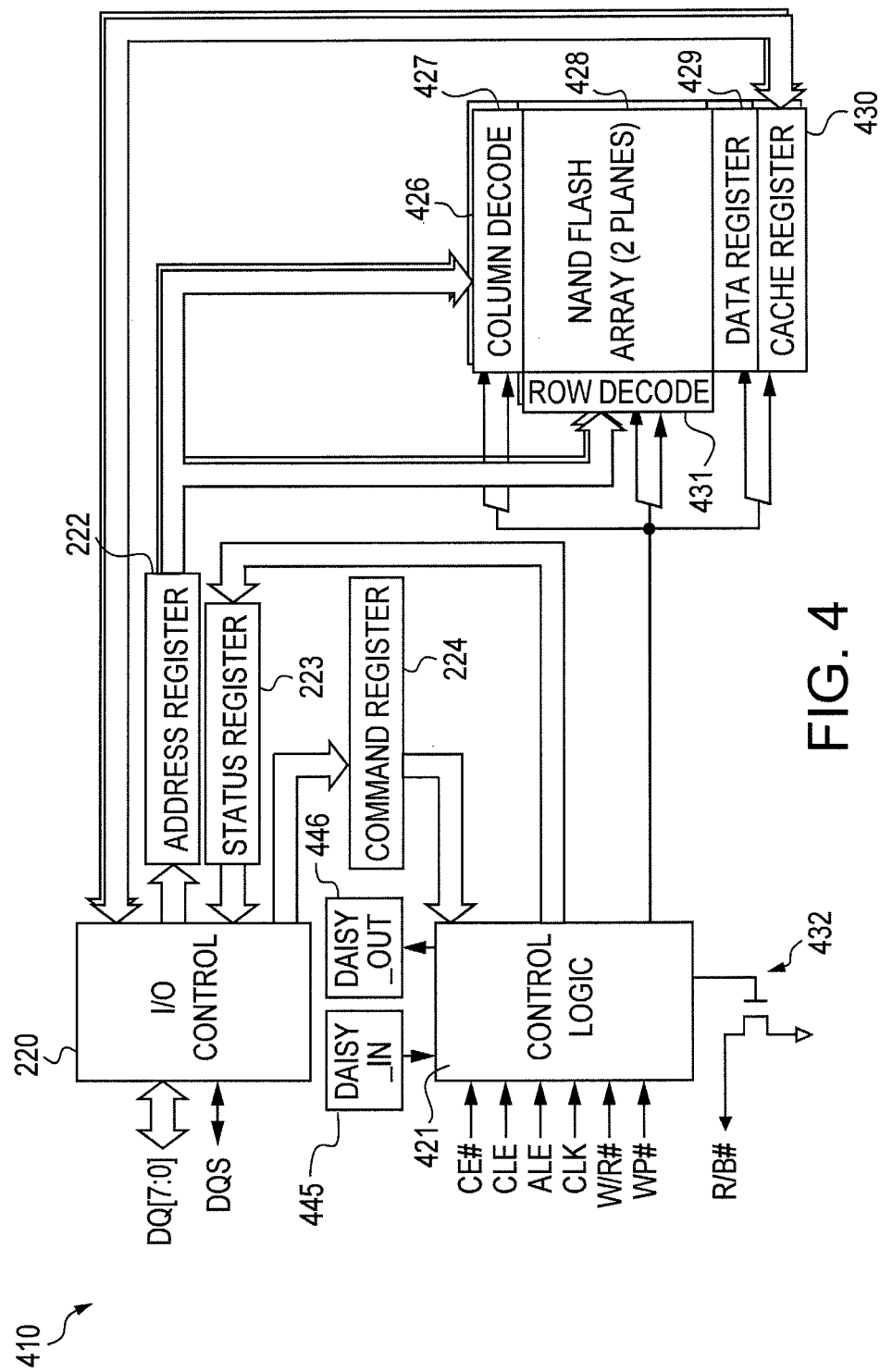
FIG. 4 is a functional block diagram of control circuitry for a logical unit of a memory device in accordance with embodiments described herein.

FIG. 4 is a functional block diagram of control circuitry 410 for a logical unit of a memory device 300. Each of logical units 310-313 may include substantially similar or identical control circuitry 410.

Figure 1:
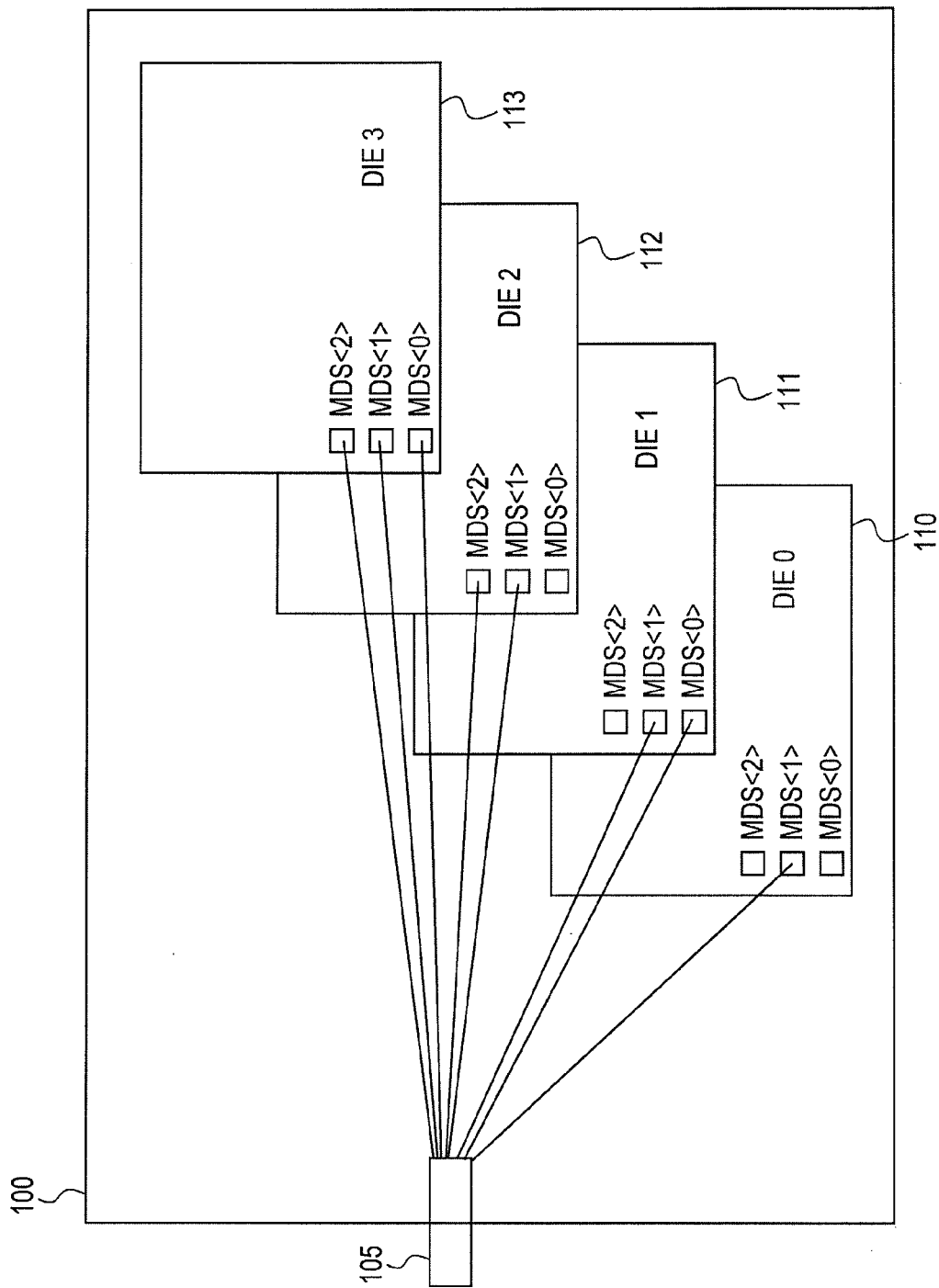
FIG. 1 is a block diagram of a conventional memory device.
Figure 2:
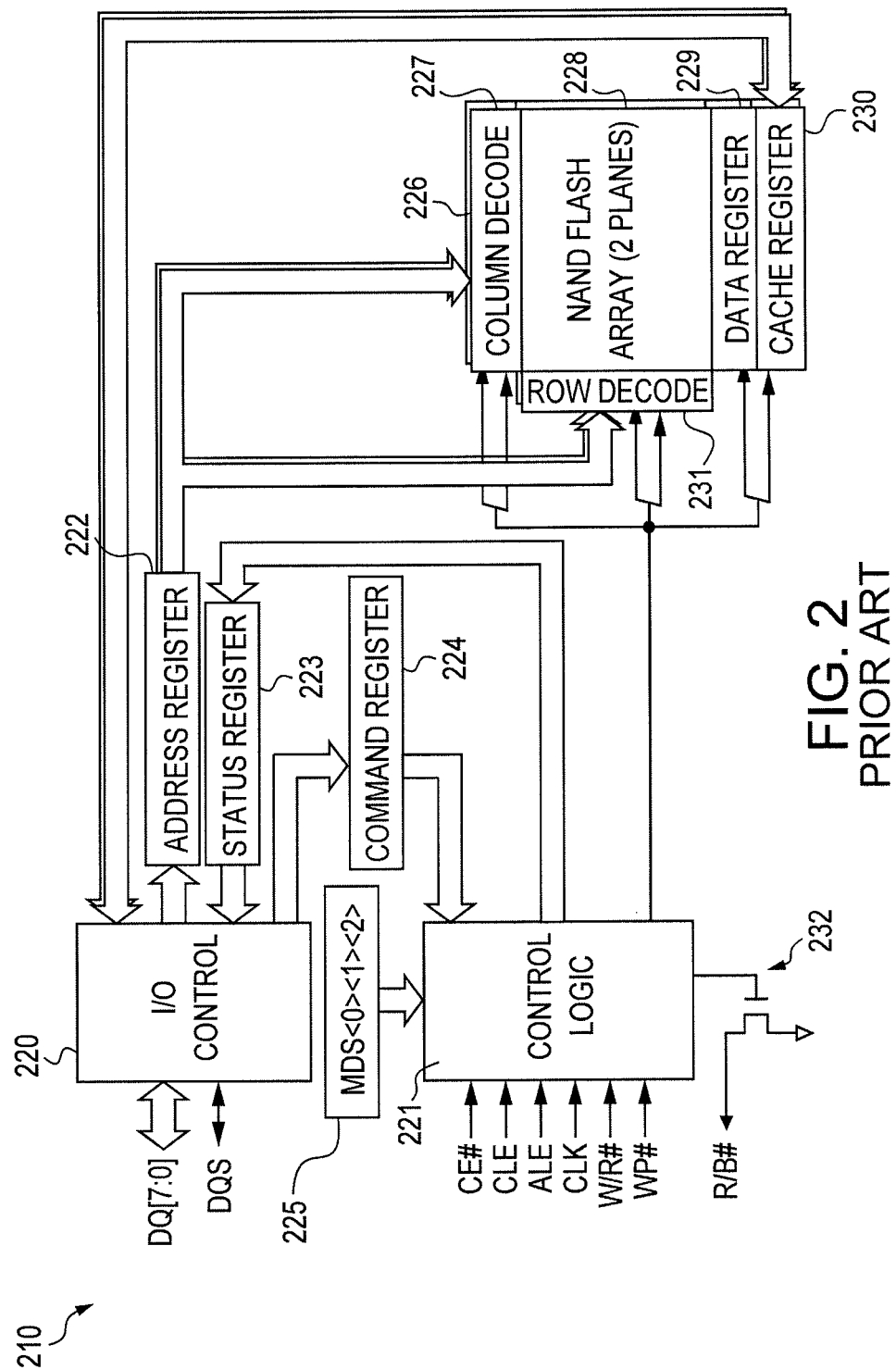
FIG. 2 is a functional block diagram of control circuitry for a conventional logical unit of a memory device.

Control circuitry 410 includes an input/output control circuit 220 for controlling the transfer of data, command, and address signals to and from the logical unit. Data, command, and address signals received by control circuitry 410 may be multiplexed onto a single set of pins DQ[7:0] and received by the input/output control circuit 220. Input/output control circuit 220 may also receive a data strobe signal DQS that provides a synchronous reference for data input and output operations of the logical unit. Input/output control 220 is coupled to an address register 222, a status register 223, and a command register 224. Input/output control circuit 220 and registers 222, 223, 224 perform substantially similar functions as described above with regard to control circuitry 210 (FIG. 2).

Control circuitry 410 is operably coupled to a memory section 426 of the logical unit for storing data. Memory section 426 may include an array 428 of memory cells, which may be NAND flash or other types of memory cells. Programming and readout of memory section 426 by row decoder 413, column decoder 427, data register 429 and cache register 430 may be conducted in a manner that is substantially identical to the programming and readout described above with regard to memory section 226 (FIG. 2).

Control circuitry 410 also includes control logic 421 for controlling internal operations of the logical unit. As discussed further below, in addition to controlling internal operations of the logical unit, control logic 421 is also configured to assign a logical unit address to the respective logical unit during a logical unit address assignment process, such as one performed during an initialization of memory device 300.

Control logic 421 receives command signals from command register 224. Control logic 421 also receives multiple control signals, including an address input control signal DAISY_IN from an address input contact 445. Control logic 421 may also receive other control signals for controlling operations of the logical unit, such as a chip enable signal CE#, a command latch enable signal CLE, an address latch enable signal ALE, a clock signal CLK, a write/read enable signal W/R#, and/or a write protect signal WP#, as described above with regard to control logic 221 (FIG. 2).

Control logic 421 also receives an external die address signal EXT_DIE_ADDR indicating a logical unit 310-313 in memory device 300 upon which operations are desired to be performed. External die address signal EXT_DIE_ADDR may be a binary address of one or more bits that is transmitted by a memory controller (not shown) of memory device 300, and received by control circuitry 410 through the combined pins DQ[7:0] for receiving data, command, and address signals. EXT_DIE_ADDR may be transmitted to control logic 421 from input/output control 220 directly from I/O control 220, may be latched into address register 222 and transmitted from address register 222 to control logic 421, or may be latched into command register 224 and received by logic circuitry 443 from command register 224.

Control logic 421 outputs commands to memory section 426 to control read, write, and/or erase operations at memory section 426. Control logic 421 may also be configured to output an address output control signal DAISY_OUT to an address output contact 446. Control logic 421 may also be configured to output logical unit status signals to status register 223.

Figure 5:
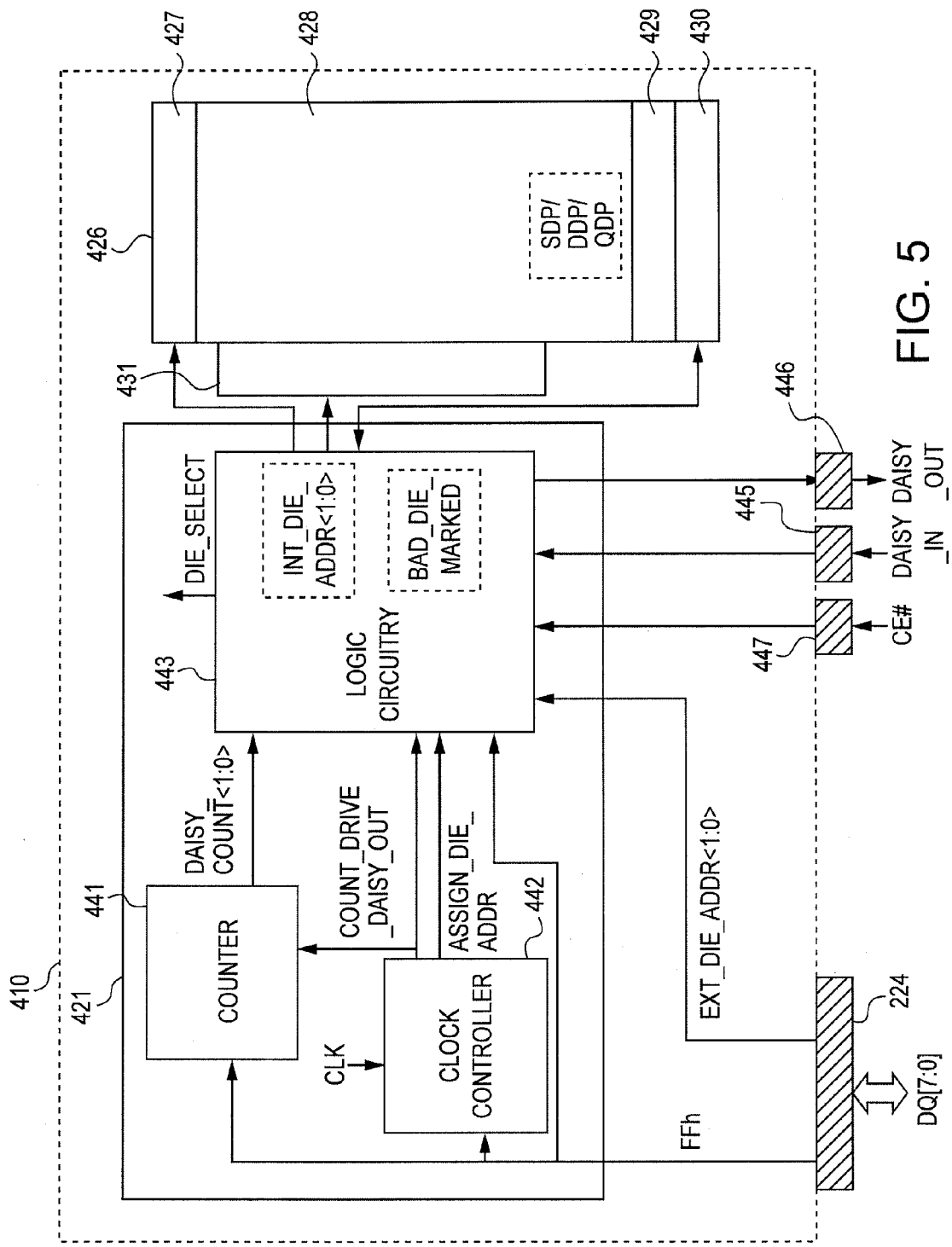
FIG. 5 is a functional block diagram of control logic for a logical unit of a memory device in accordance with embodiments described herein.

FIG. 5 is a functional block diagram showing features of control logic 421 which pertain to the embodiment shown in FIGS. 3 and 4 and a portion of memory section 426. It should be understood that effort has been made only to show circuits and signals relevant to the described embodiments, and that the control circuitry of a logical unit may include other circuits and signals not shown here.

Control logic 421 includes a clock controller 442 that is configured to receive a clock signal CLK and a signal based on a command (e.g., command FFh) being latched into command register 224. Clock controller 442 is configured to output an ASSIGN_DIE_ADDR control signal to logic circuitry 443, as described further below. Clock controller 442 is also configured to output a COUN_DRIVE_DAISY_OUT control signal to logic circuitry 443 and to a counter 441, as described further below. Clock controller 442 may be implemented using standard timing circuitry that is know in the art, or may be programmed as part of a programmable logic device, for example.

Control logic 421 also includes counter 441, which is also configured to receive a signal based on the command (e.g., command FFh) being latched into command register 224. Counter 441 is configured to change (e.g., increment or, in the case of a downward counter, for example, decrement) a count value in response to the COUNT_DRIVE_DAISY_OUT control signals received from clock controller 442, and is configured to output a count value DAISY_COUNT to logic circuitry 443. Counter 441 may be implemented using a separate circuit, or may be implemented on a same programmable logic device as other logic circuitry 443 and/or clock controller 442, for example.

Control logic 421 also includes logic circuitry 443, which is also configured to receive a signal based on the command (e.g., command FFh) being latched into command register 224. Logic circuitry 443 is configured to receive ASSIGN_DIE_ADDR and COUNT_DRIVE_DAISY_OUT control signals from clock controller 442, and is configured to receive a count value DAISY_COUNT from counter 441. Logic circuitry is also configured to receive an address input control signal DAISY_IN from an address input contact 445, and a chip enable signal CE# from another external contact 447. Logic circuitry 443 is also configured to receive an external die address signal EXT_DIE_ADDR, for example from address register 222 during an address cycle. Logic circuitry 443 is configured to output instructions to memory section 426 that control memory section 426 to store and/or output various values from memory array 428. Logic circuitry 443 is also configured to output an address output control signal DAISY_OUT from an address output contact 446, and a DIE_SELECT control signal indicating that the respective logical unit has been selected for operation. These functions are described further below.

Control logic 421 may also be configured to store a logical unit address INT_DIE_ADDR of the respective logical unit, for example, in memory of logic circuitry 443. Logical unit address INT_DIE_ADDR may also be stored in address register 222. As described further below with regard to FIG. 5, INT_DIE_ADDR is derived from count value DAISY_COUNT from counter 441, and may be a binary value, such as a two bit binary value. Control logic 421 may also be configured to store an indication designating that the respective logical unit is defective, for example. As described further below with regard to FIGS. 7-8, determination of a defective logical unit can be made during testing of each logical unit, and a defective logical unit can be designated by storing a BAD_DIE_MARKED indicator, for example by using an electronic fuse or in a memory in control logic 421. The BAD_DIE_MARKED indicator may be, for example, an assigned bit that is marked as a first logic value for a desirable (e.g., non-defective) logical unit, and as a second logic value for a defective logical unit. In one example, the BAD_DI- E_MARKED indicator may be stored using a fuse or other memory device logic circuitry 443.

In addition to data received from external sources during normal operation of memory device 300 (FIG. 3), memory section 426 may also be configured to store information regarding the configuration of memory device 300, such an SDP/DDP/QDP value indicating whether memory device 300 is configured as an SDP, DDP, or QDP memory device. The SDP/DDP/QDP value may be a single binary value of one or more bits stored in memory section 426, or may include multiple different bits with each different bit corresponding to a different possible memory device configuration. This device configuration information can also be used by control circuitry 410 to determine how many logical units in memory device 310 should be assigned logical unit addresses.

Figure 6:
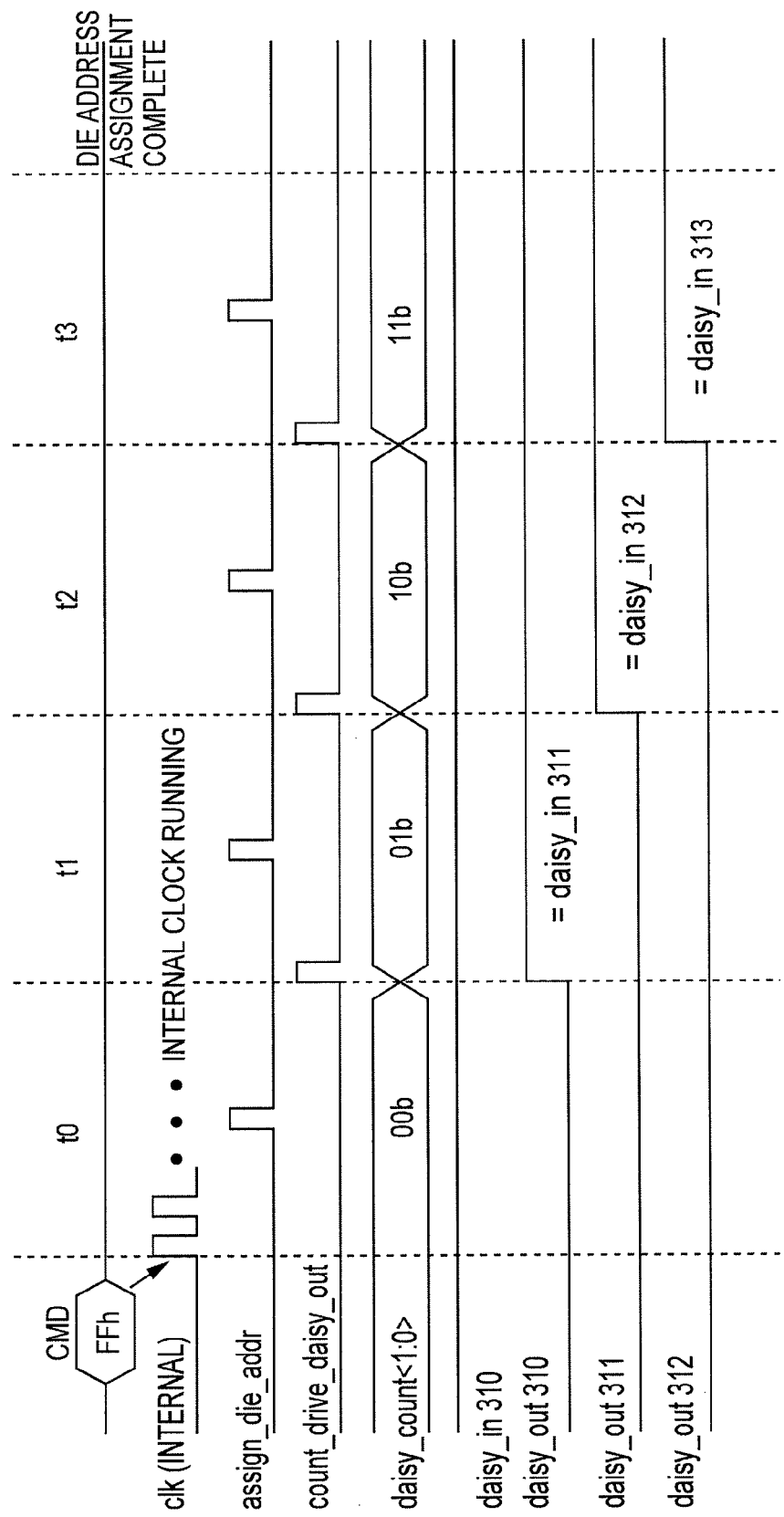
FIG. 6 is a timing diagram illustrating an address assignment process for logical units of a memory device in accordance with embodiments described herein.

FIG. 6 is a timing diagram illustrating a logical unit address assignment process for logical units arranged in a daisy chain configuration, such as logical units 310-313 of memory device 300. The logical unit address assignment process assigns a logical unit address to each logical unit 310-313 in memory device 300 sequentially during memory device 300 initialization, as described further below.

As discussed above, each of logical units 310-313 may include substantially identical control circuitry 410. The clock signal CLK for operations in each control circuitry 410 may be synchronized using various techniques, including using logical units formed on one or more dice that are designed to have the same target clock frequency. Accordingly, it should be understood that several control signals generated internally by each respective control circuitry 410 for each logical unit 310-313 may be substantially identical. For example, the respective control circuitry 410 in each logical unit 310-313 may receive a command signal (e.g., command FFh) at substantially the same time, and the internal clock signal CLK, ASSIGN_DIE_ADDR control signal, COUNT_DRIVE_DAISY_OUT signal, and count value DAISY_COUNT signal in each logical unit 310-313 may occur and/or be changed substantially synchronically.

The timing of a logical unit address assignment process shown in FIG. 6 is configured to assign logical unit addresses to logical units 310-313 arranged in a daisy chain configuration, as shown in FIG. 3. Accordingly, the address output control signal DAISY_OUT of logical unit 310 corresponds to the address input control signal DAISY_IN of logical unit 311, the address output control signal DAISY_OUT of logical unit 311 corresponds to the address input control signal DAISY_IN of logical unit 312, and the address output control signal DAISY_OUT of logical unit 312 corresponds to the address input control signal DAISY_IN of logical unit 313.

The logical unit address assignment process may be configured to sequentially assign an address to each respective logical unit 310-313 when the respective address input contact 445 of the logical unit receives a signal, such as, for example, a logic high address input control signal DAISY_IN, and the respective address output contact 446 of the logical unit is outputting, for example, a logic low address output control signal DAISY_OUT. In such an embodiment, the address input contact 445 of first logical unit in the sequence (e.g., logical unit 310) may be connected to a voltage 305 (such as a device voltage or other reference voltage), resulting in the address input control signal DAISY_IN being fixed at a logic high signal. The address output contact 446 of a last logical unit in the sequence (e.g., logical unit 313) may be left floating or connected to ground.

Although the logical unit address assignment process shown in FIG. 6 includes assigning a logical unit address to a logical unit when the respective address input contact 445 of the logical unit receives a logic high address input control signal DAISY_IN and the respective address output contact 446 of the logical unit is outputting a logic low address output control signal DAISY_OUT, it should be understood that this relationship could be subject to design choice. For example, in another embodiment, the address assignment process may be configured to assign an address to each respective logical unit 310-313 when the respective address input contact 445 of the logical unit receives a logic low address input control signal DAISY_IN and the respective address output contact 446 of the logical unit is outputting a logic high address output control signal DAISY_OUT. In such an embodiment, the address input contact 445 of logical unit 310 may be connected to ground. The address output contact 446 of logical unit 313 may be connected to voltage 305 or left floating.

As shown in FIG. 6, in the control circuitry 410 for each logical unit 310-313, counter 441, clock controller 442, and logic circuitry 443 are each reset. Some of these elements may default to a reset condition upon power up of control circuitry 410, or may be reset when a command FFh is received at a beginning of assignment period t0. For each logical unit 310-313, the count value DAISY_COUNT in counter 441 is reset to a default value, such as 00 (binary), and the address output control signal DAISY_OUT is reset to a default value (e.g., a logic low value). In another embodiment, logic circuitry 443 may be configured to drive the address output control signal DAISY_OUT only when the ASSIGN_DIE_ADDR control signal is active, and may be left floating at other times.

During assignment period t0, for each logical unit 310-313, a respective counter 441 outputs count value DAISY_COUNT to respective logic circuitry 443, and a respective clock controller 442 generates and outputs ASSIGN_DIE_ADDR control signal to the respective logic circuitry 443. For each logical unit 310-313, the respective logic circuitry 443 is configured to determine whether it is receiving an address input control signal DAISY_IN at a respective particular logic value (e.g., a logic high value), and whether it is outputting an address output control signal DAISY_OUT at a respective particular logic value (e.g., a logic low signal). If these conditions are true, then logic circuitry 443 is configured to assign the count value DAISY_COUNT as the logical unit address INT_DIE_ADDR for the respective logical unit in response to receiving a pulse of the ASSIGN_DIE_ADDR signal from clock controller 442. For example, logic circuitry 443 may store the logical unit address INT_DIE_ADDR internally, or may store the logical unit address INT_DIE_ADDR in address register 222. If these conditions are not true, then logic circuitry 443 is configured to not assign a logical unit address to the respective logical unit at that time.

During assignment period t0, because address input contact 445 of logical unit 310 is electrically connected to a voltage 305, address input control signal DAISY_IN of logical unit 310 is a logic high value. Because address output control signals DAISY_OUT for logical units 310, 311, and 312 are set to a logic low signal, address input control signal DAISY_IN of logical units 311, 312, and 313 are logic low values. Accordingly, the count value DAISY_COUNT (e.g., here, the count value 00) is assigned as the logical unit address INT_DIE_ADDR of logical unit 310, while logical units 311, 312, and 313 are not assigned a logical unit address at this time.

At a beginning of assignment period t1, clock controller 442 pulses the COUNT_DRIVE_DAISY_OUT control signal. In response to receiving the pulse of the COUNT_

DRIVE_DAISY_OUT control signal, counter 441 changes (e.g., increments) the count value DAISY_COUNT, for example to a value of 01 (binary). In response to receiving the pulse of the COUNT_DRIVE_DAISY_OUT, logic circuitry 443 of memory device 300 is configured to output a logic high signal as the address output control signal DAISY_OUT if the respective logic circuitry 443 is receiving a logic high signal as the address input control signal DAISY_IN. Accordingly, logic circuitry 443 of logical unit 310 is configured to drive address output control signal DAISY_OUT to a logic high signal, while the logic circuitry 443 of logical units 311, 312, 313 would be configured to maintain the respective address output control signals DAISY_OUT at a logic low (or floating) signal.

During assignment period t1, because logical unit 310 is outputting a logic high signal for address output control signal DAISY_OUT, the address input control signal DAISY_IN of logical unit 311 is also a logic high signal. Accordingly, the logic circuitry 443 of logical unit 311 is configured to assign the current value of count value DAISY_COUNT (e.g.,01 binary) as the logical unit address of logical unit 311.

At a beginning of assignment period t2, in response to receiving another pulse of the COUNT_DRIVE_DAISY_OUT control signal, counter 441 changes (e.g., increments) the count value DAISY_COUNT, for example to a value of 10 (binary). Logic circuitry 443 of logical unit 311 is configured to drive address output control signal DAISY_OUT to a logic high signal, while the logic circuitry 443 of logical units 312 and 313 would be configured to maintain the respective address output control signals DAISY_OUT at a logic low (or floating) signal.

During assignment period t2, because logical unit 311 is outputting a logic high signal for address output control signal DAISY_OUT, the address input control signal DAISY_IN of logical unit 312 is also a logic high signal. Accordingly, the logic circuitry 443 of logical unit 312 is configured to assign the current value of count value DAISY_COUNT (e.g., 10 binary) as the logical unit address of logical unit 312.

At a beginning of assignment period t3, in response to receiving another pulse of the COUNT_DRIVE_DAISY_OUT control signal, counter 441 changes (e.g., increments) the count value DAISY_COUNT, for example to a value of 11 (binary). Logic circuitry 443 of logical unit 312 is configured to drive address output control signal DAISY_OUT to a logic high signal, while the logic circuitry 443 of logical unit 313 is configured to maintain address output control signal DAISY_OUT at a logic low (or floating) signal.

During assignment period t3, because logical unit 312 is outputting a logic high signal for address output control signal DAISY_OUT, address input control signal DAISY_IN of logical unit 313 is also a logic high signal. Accordingly, the logic circuitry 443 of logical unit 313 is configured to assign the current value of count value DAISY_COUNT (e.g., 11 binary) as the logical unit address of logical unit 313.

The logical unit address assignment process of FIG. 6 is complete when all logical units 310-313 in memory device 300 (FIG. 3) have been assigned a logical unit address. Logic circuitry 443 may determine the number of logical unit addresses to be assigned by referencing an SDP/DDP/QDP value that is stored in memory section 426, where the SDP/DDP/QDP value indicates whether memory device 300 is configured as an SDP, DDP, or QDP memory device.

After assigning a logical unit address to a last logical unit in the sequence (e.g., logical unit 313), there is no need to further change (e.g., increment) the count value DAISY_COUNT or to drive the address output control signal DAISY_OUT of the last logical unit to a logic high value. After the logical unit address assignment process is complete, a trim load process might be performed on memory device 300, as well as additional manufacturing and/or testing processes.

In the embodiment of a logical unit address assignment process shown in FIG. 6, logical units 310, 311, 312, and 313 are sequentially assigned logical unit addresses, e.g., 00, 01, 10, and 11, respectively. Referring back to FIGS. 3-5, during operation of memory device 300, data, command, and address information is provided to memory device 300 in order to read, write, access, and/or erase data stored in logical units 310-313. In order to select the relevant logical unit from logical units 310-313 in memory device 300, a memory controller (not shown) might transmit a chip enable signal CE# to external contact 447, and an external logical unit address EXT_DIE_ADDR might be, for example, latched into the address register 222 in each of logical units 310-313. A received chip enable signal CE# indicates that the target containing the logical unit is selected. For example, all logical units in memory device 300 may be arranged as part of a single target. The received external logical unit address EXT_DIE_ADDR indicates which logical unit 310-313 within the target is selected.

Logic circuitry 443 references the configuration information SDP/DDP/QDP stored in memory section 426 to determine how many bits of the external logical unit address EXT_DIE_ADDR should be analyzed. For example, if the configuration information SDP/DDP/QDP indicates that the respective logical unit is part of a memory device 300 configured as an SDP memory device, logic circuitry 443 does not need to analyze the external logical unit address EXT_DIE_ADDR because the respective logical unit is the only logical unit within the target. If the configuration information SDP/DDP/QDP indicates that the respective logical unit is part of a memory device 300 configured as a DDP memory device, logic circuitry 443 looks at one bit (e.g., a least significant bit) of the external logical unit address EXT_DIE_ADDR and compares it to one bit (e.g., a least significant bit) of the assigned logical unit address INT_DIE_ADDR to determine whether the respective logical unit is selected. If the configuration information SDP/DDP/QDP indicates that the respective logical unit is part of a memory device 300 configured as a QDP memory device, logic circuitry 443 looks at two bits (e.g., a least significant bit and a second least significant bit) of the external logical unit address EXT_DIE_ADDR and compares it to two bits (e.g., a least significant bit and a second least significant bit) of the assigned logical unit address INT_DIE_ADDR to determine whether the respective logical unit is selected.

If logic circuitry 443 determines that the respective logical unit is selected by the external logical unit address EXT_DIE_ADDR and the chip enable signal CE#, logic circuitry 443 is configured to output a die select signal DIE_SELECT and operate according to the received data, address, and command instructions DQ[7:0] (FIG. 4).

A memory device with logical units arranged in a daisy chain configuration, as described above, can provide a memory device with a reduced size. By reducing the number of external contacts used for assigning a logical unit address to each logical unit in the memory device (i.e., three address contacts for mds<0>, mds<1>, and mds<2>in conventional memory device 100 versus two address contacts for DAISY_IN and DAISY_OUT in memory device 300), the total surface area of each logical unit 310-313 can be reduced.

The number of logical units that can be packaged in a single memory device or in a single target is also not limited by the number of address contacts on each logical unit when the logical units are arranged in a daisy chain configuration. The described daisy chain configuration can allow for a memory device to be manufactured with a higher number of logical units to be controlled by a single chip enable signal CE# (FIG. 4).

In addition, after the logical unit address assignment process is complete, one or more of the contacts used for the logical unit address assignment process can be repurposed. For example, address output contact 446 of each logical unit 310-313 (FIG. 3) may be repurposed for testing purposes, such as for acting as an entry pin during a low pin count test mode, or for other known tests.

Figure 7:
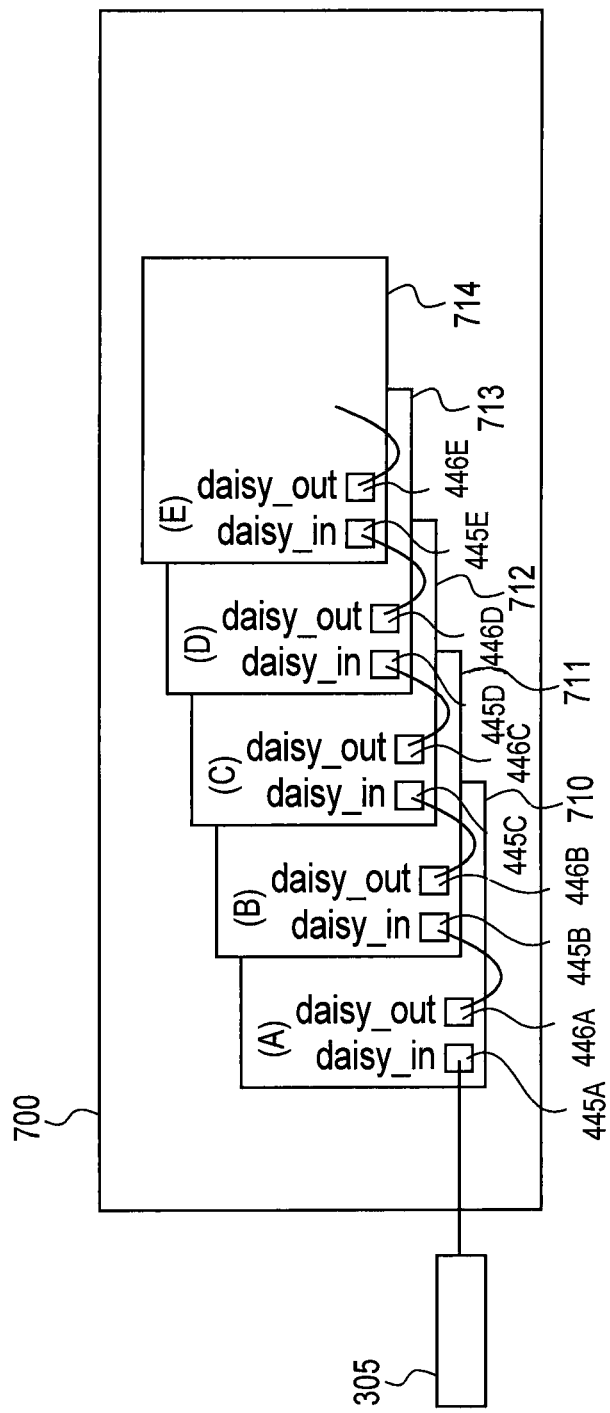
FIG. 7 is a block diagram of a memory device in accordance with another embodiment described herein.

A memory device with logical units arranged in a daisy chain configuration can also allow for one or more redundant logical units to be formed within a memory device. FIG. 7 is a block diagram of a memory device 700 including logical units 710, 711, 712, 713, 714. Logical units 710-714 are substantially identical to logical units 310-313 described above with regard to FIG. 3, and each includes control circuitry 410 described above in regard to FIGS. 4 and 5. Logical units 710-714 are arranged in a daisy chain configuration, with the address output contact 446 of each logical unit operably coupled (e.g., electrically connected or optically connected) to the respective address input contact 445 of the subsequent logical unit. Address input contact 445A of logical unit 710 is operably coupled to a voltage 305. Address output contact 446E of logical unit 714 is operably coupled to ground, or is not operably coupled to another terminal and left floating.

Memory device 700 may be configured as a QDP memory device with four logical units 710-713, with logical unit 714 included as a redundant logical unit during the manufacture of memory device 700.

During the manufacture of memory device 700, and prior to assigning logical unit addresses to each logical unit 710-714, one or more logical units (e.g., logical unit 712 in FIG. 7) in memory device 700 may be designated as defective (e.g., non-functioning or damaged). Because memory device 700 was manufactured with at least one redundant logical unit (i.e., logical unit 714), the desired memory device configuration (e.g., a QDP configuration) can still be achieved. With logical units 710-714 of memory device 700 arranged in a daisy chain configuration, logical unit addresses for the desired logical units 710, 711, 713, and 714 can be assigned without disturbing the organization of the logical units from the perspective of external devices, and without additional rewiring or other accommodations.

Figure 8:
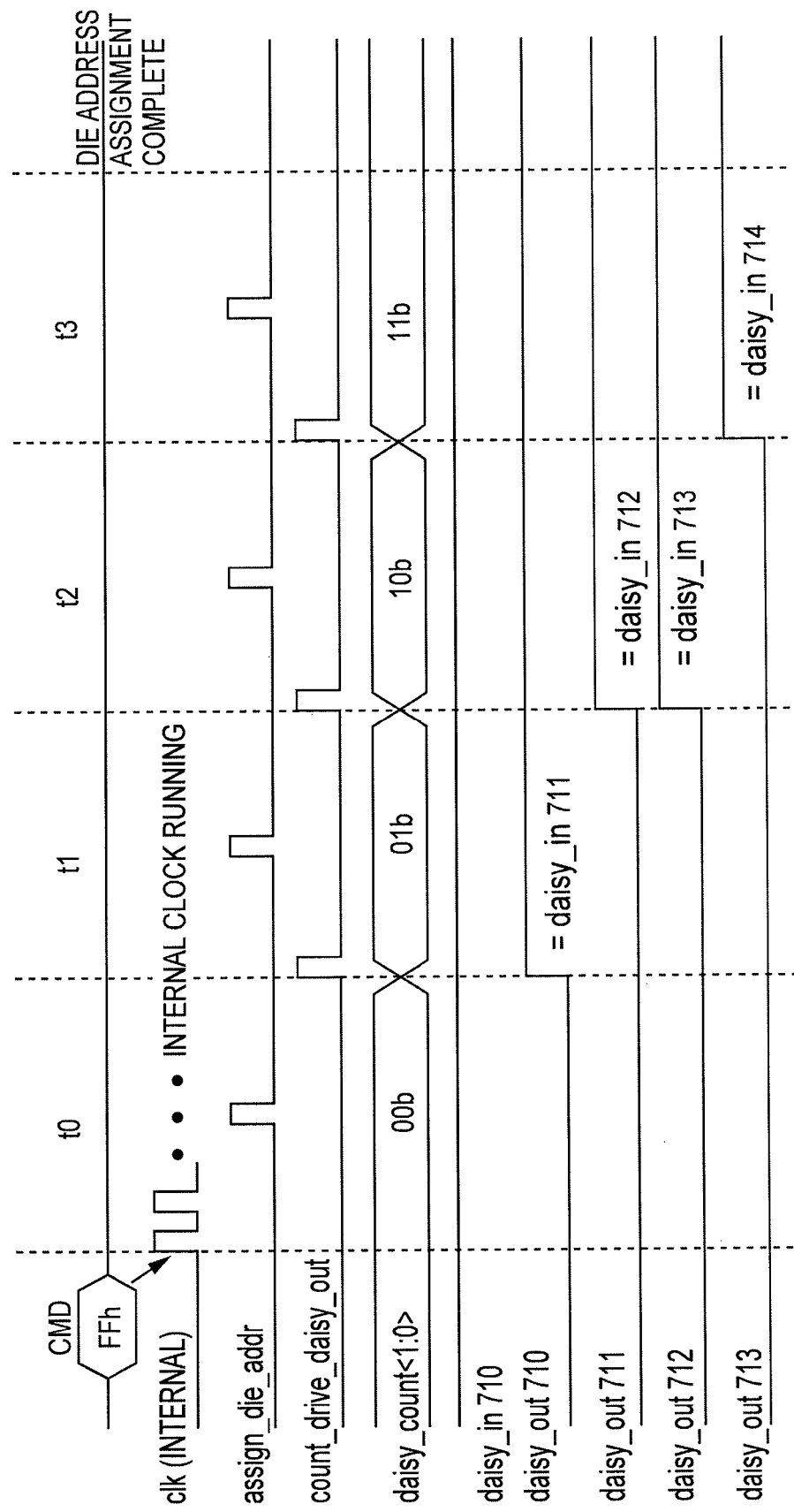
FIG. 8 is a timing diagram illustrating an address assignment technique for logical units of a memory device in accordance with another embodiment described herein.

FIG. 8 is a timing diagram illustrating a logical unit address assignment technique for logical units 710-714 of memory device 700 (FIG. 7). In the embodiment shown in FIG. 8, logical unit addresses are assigned to logical units 710, 711, 713, and 714, while logical unit 712 has been designated as defective. A defective logical unit 712 can be so designated by, for example, setting an electrical fuse in said defective logical unit 712 to indicate a BAD_DIE_MARKED value.

For each logical unit 710-714, logic circuitry 443 is configured to determine whether it is receiving an address input control signal DAISY_IN at a respective particular logic value (e.g., a logic high value), whether it is outputting an address output control signal DAISY_OUT at a respective particular logic value (e.g., a logic low signal), and whether the respective logical unit is not designated as defective (e.g., with BAD_DIE_MARKED value indicating a bad logical unit). If these conditions are true, then logic circuitry 443 is configured to assign the count value DAISY_COUNT as the logical unit address for the respective logical unit in response to receiving a pulse of the ASSIGN_DIE_ADDR control signal from clock controller 442. If logic circuitry 443 determines that it is not receiving an address input control signal DAISY_IN at the respective particular logic value (e.g., a logic high value), or that it is not outputting an address output control signal DAISY_OUT at the respective particular logic value (e.g., a logic low signal), then logic circuitry 443 is configured to not assign a logical unit address to the respective logical unit at that time.

In addition, if logic circuitry 443 determines that it is receiving an address input control signal DAISY_IN at the respective particular logic value (e.g., a logic high value), and that it is outputting an address output control signal DAISY_OUT at the respective particular logic value (e.g., a logic low signal), but also determines that the respective logical unit is designated as defective (e.g., with BAD_DIE_MARKED value indicating a bad logical unit), logic circuitry 443 is configured to not assign a logical unit address to the respective logical unit at that time, and to output, for example, a logic high value as its address output control signal DAISY_OUT, thereby passing the logic high value to the address input contact 445 of subsequent logical unit 713 during a same assignment period.

In another embodiment, upon designation of a logical unit as defective, the logic circuitry 443 of that logical unit may be configured to output an address output control signal DAISY_OUT from its address output contact 446 that matches the address input control signal DAISY_IN received at its address input contact 445 throughout the logical unit address assignment process. In this embodiment, a fuse set to indicate a defective logical unit may configure the defective logical unit to output the matching address output control signal DAISY_OUT from its address output contact 446.

Assignment of logical unit address to logical units 710 and 711 occurs during assignment periods t0 and t1 in substantially an identical manner as the assignment of logical unit address to logical units 310 and 311 discussed above in regard to FIG. 6, and will not be repeated here. During assignment periods t0 and t1, respectively, logic circuitry 443 in logical units 710 and 711 determines that they are receiving an address input control signal DAISY_IN at the respective particular logic value (e.g., a logic high value), that they are outputting an address output control signal DAISY_OUT at the respective particular logic value (e.g., a logic low signal), and that the respective logical unit has not been designated as a defective logical unit, for example by referencing a BAD_DIE_MARKED indicator, which may be stored in control logic 421 or address register 222, for example.

At a beginning of assignment period t2, in response to receiving another pulse of the COUNT_DRIVE_DAISY_OUT control signal, counter 441 changes (e.g., increments) the count value DAISY_COUNT, for example to a value of 10 (binary). Logic circuitry 443 of logical unit 711 is configured to drive address output control signal DAISY_OUT to a logic high signal, while the logic circuitry 443 of logical units 712 and 713 would be configured to maintain the respective address output control signals DAISY_OUT at a logic low (or floating) signal.

During assignment period t2, because logical unit 711 is outputting a logic high signal for address output control signal DAISY_OUT, the address input control signal DAISY_IN of logical unit 712 is also a logic high signal. Accordingly, logic circuitry 443 in logical unit 712 determines that it is receiving an address input control signal DAISY_IN at the respective particular logic value (e.g., a logic high value), and that it is outputting an address output control signal DAISY_OUT at the respective particular logic value (e.g., a logic low signal).

Logical unit 712, however, has previously been designated as defective. Accordingly, logic circuitry 443 determines that logical unit 712 has been designated as a defective logical unit, for example by referencing a BAD_DIE_MARKED value. In this case, logic circuitry 443 of logical unit 712 is configured to not assign a logical unit address to logical unit 712. Instead, as shown in FIG. 8, logic circuitry 443 of logical unit 712 is configured to output the first logic value as its address output control signal DAISY_OUT during assignment period t2, thereby passing the first logic value to the address input contact 445 of subsequent logical unit 713.

As discussed above, in another embodiment, logic circuitry 443 of logical unit 712 may be configured to retrieve the BAD_DIE_MARKED value designating logical unit 712 as a defective logical unit prior to commencing the logical unit address assignment process (i.e., prior to time t0 in FIG. 8), and configured to output an address output control signal DAISY_OUT from its address output contact 446 that matches the address input control signal DAISY_IN received at its address input contact 445 throughout the logical unit address assignment process.

According to either embodiment, still during assignment period t2, logical unit 712 outputs a logic high signal for address output control signal DAISY_OUT, causing the address input control signal DAISY_IN of logical unit 713 to also be a logic high signal. Accordingly, logic circuitry 443 in logical unit 713 determines that it is receiving an address input control signal DAISY_IN at the respective particular logic value (e.g., a logic high value), that it is outputting an address output control signal DAISY_OUT at the respective particular logic value (e.g., a logic low signal), and that logical unit 713 has not been identified as a defective logical unit. Accordingly, the logic circuitry 443 of logical unit 713 is configured to assign the current value of count value DAISY_COUNT (e.g., 10 binary) as the logical unit address of logical unit 713.

Assignment of a logical unit address to logical unit 714 occurs during assignment period t3 in substantially an identical manner as the assignment of a logical unit address to logical unit 714 discussed above in regard to FIG. 6, and will not be repeated here.

In the embodiment of a logical unit address assignment process shown in FIG. 8, logical units 710, 711, 713, and 714 are assigned logical unit addresses 00, 01, 10, and 11, respectively, while logical unit 712 is not assigned a logical unit address. In this manner, logical unit addresses for the desired logical units 710, 711, 713, and 714 can be assigned without disturbing the organization of the logical units from the perspective of external devices, and without additional accommodations. Accordingly, during operation of memory device 700, data, command, and address information provided to memory device 700 in order to read, write, access, and/or erase data stored in logical units 710, 711, 713, 714 can be operated upon by the control circuitry 410 of the appropriate logical unit 710, 711, 713, 714 according to a chip enable signal CE# and an external logical unit address EXT_DIE_ADDR, as described above.

The above description and drawings are only to be considered illustrative of specific embodiments, which achieve the features and advantages described herein. Modification and substitutions to specific processes, components, and structures can be made. For example, it should be understood that appropriate types of memory cells and appropriate control signals other than those specifically described in connection with the above embodiments may be used. Accordingly, the embodiments of the invention are not to be considered as being limited by the foregoing description and drawings, but only by the scope of the appended claims.

What is claimed as new and desired to be protected by Letters Patent of the United States is:

1. A logical unit of a memory device, said logical unit comprising:
   a memory array;
   stored memory device configuration data, wherein the memory device configuration data is indicative of a memory device type containing the logical unit;
   an address input configured to receive an address input control signal;
   an address output configured to output an address output control signal;
   a counter having a count value; and
   control circuitry configured to assign a logical unit address to the logical unit in response to said address input control signal and said address output control signal, said logical unit address being based on said count value, and further configured to determine the memory device type based upon the stored memory device configuration data and to determine how many logical units should be assigned logical unit addresses based on the determined memory device type.

2. The logical unit of claim 1, wherein said address output is operably coupled to an address input of another logical unit.

3. The logical unit of claim 1, wherein said address input is operably coupled to a voltage.

4. The logical unit of claim 1, wherein said address input is operably coupled to an address output of another logical unit.

5. The logical unit of claim 1, wherein said control circuitry comprises:
   a clock controller configured to output a control signal,
   wherein said counter is configured to change said count value in response to said control signal, and wherein said control circuitry is configured to assign said count value as said logical unit address in response to said address input control signal having a first particular logic value and said address output control signal having a second particular logic value.

6. The logical unit of claim 5, said control circuitry further comprising:
   logic circuitry configured to assign said logical unit address to said memory array,
   wherein said counter is configured to output said count value to said logic circuitry, and
   wherein said clock controller is further configured to output an assign address signal to said logic circuitry, and
   wherein said logic circuitry is configured to assign said count value as said logical unit address of said logical unit in response to said address input control signal, said address output control signal, and said assign address signal.

7. The logical unit of claim 5, wherein said first particular logic value is a logic high value, and said second particular logic value is a logic low value.

8. The logical unit of claim 6, wherein said logic circuitry is configured to set said address output control signal to said first particular logic value after assigning said logical unit address to said logical unit.

9. The logical unit of claim 1, wherein said control circuitry is configured to not assign said logical unit address if said logical unit is designated as defective.

10. The logical unit of claim 9, wherein said control circuitry is configured to set said address output signal to said first particular logic value if said logical unit is designated as defective.

11. An apparatus comprising:
a plurality of logical units, wherein each of said logical units comprises:
   a memory array;
   a storage device for storing memory device configuration data, wherein the memory device configuration data is indicative of a memory device type of the apparatus;
   control circuitry configured to assign a logical unit address to said logical unit and further configured to determine the memory device type of the apparatus based on the stored memory device configuration data and to determine how many logical units should be assigned logical unit addresses based on the determined memory device type;
   an address input configured to receive an address input control signal;
   an address output configured to output an address output control signal; and
   a counter having a count value,
wherein an address output of a first logical unit of said plurality of logical units is operably coupled to an address input of a second logical unit of said plurality of logical units, and wherein said logical unit address is based on said count value.

12. The apparatus of claim 11, wherein said plurality of logical units are arranged in a daisy chain configuration.

13. The apparatus of claim 11, wherein said control circuitry of each respective logical unit is configured to assign said respective logical unit address in response to said respective address input control signal of said logical unit having a first particular logic value and said respective address output control signal of said respective logical unit having a second particular logic value.

14. The apparatus of claim 13, wherein said control circuitry of each respective logical unit is configured to set said respective address output control signal to said first particular logic value after assigning said respective logical unit address.

15. The apparatus of claim 11, wherein said respective control circuitry of said logical units is configured to assign a unique logical unit address for each logical unit of the plurality of logical units.

16. The apparatus of claim 11, wherein said respective control circuitry of said logical units is configured to assign a unique logical unit address for each logical unit during separate assignment periods.

17. The apparatus of claim 13, wherein said first particular logic value and said second particular logic value are different logic values.

18. The apparatus of claim 13, said control circuitry further comprising:
   logic circuitry configured to assign said logical unit address; and
   a counter configured to change a count value in response to said control signal and output said count value to said logic circuitry,
   wherein said counter is configured to change said count value in response to said control signal and output said count value to said logic circuitry, and wherein said logic circuitry is configured to assign said count value as said logical unit address in response to said address input control signal having said first particular logic value, said address output control signal having said second particular logic value, and a particular state of said assign address signal.

19. A method comprising:
   determining a memory device type of a memory device based on stored memory device configuration data;
   determining how many logical units in the memory device should be assigned logical unit addresses based on the determined memory device type;
   assigning a first logical unit address to a first logical unit in the memory device according to a count value during a first assignment period;
   changing said count value after assigning said first logical unit address to said first logical unit;
   after changing said count value, determining if a second logical unit address should be assigned based on the determined number of logical units that should be assigned logical unit addresses; and
   assigning a second logical unit address to a second logical unit in said memory device according to said changed count value during a second assignment period if it is determined that a second logical unit address should be assigned,
wherein each logical unit comprises a memory array.

20. The method of claim 19, further comprising:
   after assigning said second logical unit address to said second logical unit in said memory device, further changing said count value; and
   assigning a third logical unit address to a third logical unit in said memory device according to said further changed count value.

21. The method of claim 19, wherein assigning a logical unit address to a first logical unit comprises:
   determining that an address input control signal received by said first logical unit has a first logic value;
   determining that an address output control signal output by said first logical unit has a second logic value;
   assigning said first logical unit address to said first logical unit in said memory device according to said count value; and
   setting said address output control signal output by said first logical unit to said first logic value.

22. The method of claim 21, wherein said address output control signal output by said first logical unit is provided to said second logical unit.

23. The method of claim 22, wherein assigning said second logical unit address to said second logical unit comprises:
   determining that an address input control signal received by said second logical unit has said first logic value, wherein said address input control signal received by said second logical unit is controlled by said address output control signal output by said first logical unit;
   determining that an address output control signal output by said second logical unit has said second logic value; and
   assigning said second logical unit address to said second logical unit according to said changed count value.

24. The method of claim 19, further comprising determining whether said first logical unit is a last logical unit in a sequence.

25. The method of claim 19, wherein assigning said first logical unit address to said first logical unit in said memory device according to a count value during a first assignment period further comprises:
   not assigning said first logical unit address to said first logical unit if said first logical unit has been designated as a defective logical unit.

26. A method comprising:
   determining a memory device type of a memory device using stored memory configuration data;

determining how many logical units in the memory device should be assigned logical unit addresses using the determined memory device type;

determining that an address input control signal received by a first logical unit in a memory device has a first particular logic value and an address output control signal output by said first logical unit has a second particular logic value;

assigning a logical unit address to said first logical unit based on a count value of a counter in said first logical unit; and after assigning said logical unit address of said first logical unit, setting said address output control signal output by said first logical unit to said first particular logic value, wherein said address output control signal of said first logical unit is output to a second logical unit in said memory device and wherein each logical unit comprises a memory array;

determining that said address output control signal of said first logical unit that is received by said second logical unit has said first particular logic value, and that an address output control signal output by said second logical unit has said second particular logic value; and assigning a logical unit address to said second logical unit if a second logical unit address should be assigned based on the determined number of logical units that should be assigned logical unit addresses.

27. The method of claim 26, further comprising:

determining that an address input control signal received by a third logical unit in said memory device has said first particular logic value and an address output control signal output by said third logical unit has said second particular logic value;

determining that said third logical unit is designated as defective; and without assigning a logical unit address of said third logical unit, setting said address output control signal output by said third logical unit to said second particular logic value.

28. The method of claim 26, wherein each of said logical units comprises a respective counter configured to output a respective count value, said method further comprising:

for each of said logical units that are not designated as defective, assigning said respective count value as said logical unit address during a respective one of a plurality of assignment periods.

29. The method of claim 28, further comprising, during each of said plurality of assignment periods, changing said count value of each of said counters.

30. The method of claim 26, further comprising:

determining whether the second logical unit is designated as defective.

31. The method of claim 29, further comprising, prior to said plurality of assignment periods:

resetting said count value of each of said counters in response to a received command signal.

32. The logical unit of claim 1, wherein the determined memory device type identifies the number of die per package.

33. The logical unit of claim 32, wherein the determined memory device type is selected from the group of single-die package (SDP), dual die package (DDP) and quadruple die package (QDP).

34. The apparatus of claim 11, wherein the determined memory device type identifies the number of die per package.

35. The apparatus of claim 34, wherein the determined memory device type is selected from the group of single-die package (SDP), dual die package (DDP) and quadruple die package (QDP).

36. The method of claim 19, wherein the determined memory device type identifies the number of die per package.

37. The method of claim 36, wherein the determined memory device type is selected from the group of single-die package (SDP), dual die package (DDP) and quadruple die package (QDP).

38. The method of claim 26, wherein the determined memory device type identifies the number of die per package.

39. The method of claim 38, wherein the determined memory device type is selected from the group of single-die package (SDP), dual die package (DDP) and quadruple die package (QDP).

* * * * *